(12) United States Patent
Brainard et al.

(10) Patent No.: US 8,747,598 B2
(45) Date of Patent: Jun. 10, 2014

(54) METHOD OF FORMING A PERMANENTLY SUPPORTED LAMINA

(75) Inventors: Robert Brainard, Sunnyvale, CA (US); Bin Zhang, Fremont, CA (US)

(73) Assignee: GTAT Corporation, Merrimack, NH (US)

( * ) Notice: Subject to any disclaimer, the term of this patent is extended or adjusted under 35 U.S.C. 154(b) by 43 days.

(21) Appl. No.: 13/456,134

(22) Filed: Apr. 25, 2012

(65) Prior Publication Data

US 2013/0284353 A1    Oct. 31, 2013

(51) Int. Cl.
*C09J 5/02* (2006.01)
*B29C 63/48* (2006.01)

(52) U.S. Cl.
USPC ..... 156/235; 156/241; 156/307.3; 156/307.5; 156/711; 156/713

(58) Field of Classification Search
USPC ........... 156/230, 235, 241, 289, 307.1, 307.3, 156/307.5, 701, 711, 712, 713; 428/57, 68, 428/149, 150, 162, 455, 458, 459, 464
See application file for complete search history.

(56) References Cited

U.S. PATENT DOCUMENTS

| | | | |
|---|---|---|---|
| 7,226,812 B2 * | 6/2007 | Lu et al. | 438/114 |
| 7,635,636 B2 | 12/2009 | Mcclure et al. | |
| 7,713,835 B2 | 5/2010 | Pillalamarri | |
| 7,795,113 B2 | 9/2010 | Swinnen et al. | |
| 8,268,645 B2 * | 9/2012 | Kell et al. | 438/19 |
| 2004/0266947 A1 | 12/2004 | Macedo et al. | |
| 2007/0000595 A1 | 1/2007 | Prack | |
| 2007/0216042 A1 | 9/2007 | Delprat et al. | |
| 2010/0009488 A1 | 1/2010 | Sivaram et al. | |
| 2011/0257296 A1 | 10/2011 | Lapointe et al. | |
| 2012/0003814 A1 | 1/2012 | Ries et al. | |

OTHER PUBLICATIONS

International Search Report and Written Opinion dated Jul. 25, 2013 for PCT Application No. PCT/US2013/034867.

* cited by examiner

*Primary Examiner* — Sing P Chan
(74) *Attorney, Agent, or Firm* — The Mueller Law Office, P.C.

(57) ABSTRACT

A method is described for forming a permanently supported thin lamina using decomposable adhesives between a lamina and a temporary support element. The temporary support element may be bonded to a first surface of the lamina. A permanent support element may be applied to a second surface of the lamina, and the temporary support element debonded from the lamina by decomposing the adhesive.

24 Claims, 7 Drawing Sheets

METHOD OF FORMING A PERMANENTLY SUPPORTED LAMINA

BACKGROUND OF THE INVENTION

In conventional methods for fabricating photovoltaic cells and other electronic devices from semiconductor wafers, the wafer is generally thicker than actually required by the device. Making thinner semiconductor wafers using conventional methods such as grinding are typically high temperature processes that may utilize temporary carriers to fix or manipulate the wafer during thinning. Adhesives used to fix semiconductor wafers to a temporary carrier during the grinding process must be stable at temperatures suitable for grinding such as above 250, 260, or 285° C. Adhesives may also be used in the manufacture of flexible electronic assemblies. Adhesives known in the art may be decomposable and exhibit thermal stability during processes such as dielectric deposition and metallization of flexible substrates or semiconductor wafers.

SUMMARY OF THE INVENTION

According to embodiments of the present invention, methods for forming a permanently supported thin lamina are provided. The methods may comprise obtaining a lamina having a first surface, a second surface, and a thickness between the first surface and the second surface, where the lamina is free from any bound support. A temporary support element may be bonded to the first surface of the lamina, using a decomposable adhesive between the lamina and the temporary support element. A permanent support element may be applied to the second surface of the lamina, and the temporary support element debonded from the lamina by decomposing the adhesive.

Aspects and embodiments will now be described with reference to the attached drawings.

DETAILED DESCRIPTION OF THE EMBODIMENTS

Recently, methods have been developed to fabricate thin lamina from semiconductor wafers on temporary or permanent supports. Lamina may be free standing and unbound to any support. The lamina may need to be transferred or in some way manipulated in order to access any side of the newly formed lamina for processing. The present description provides a method for lamina handling where the structural integrity of the lamina is preserved while other fabrication steps are occurring.

Figure 1A:
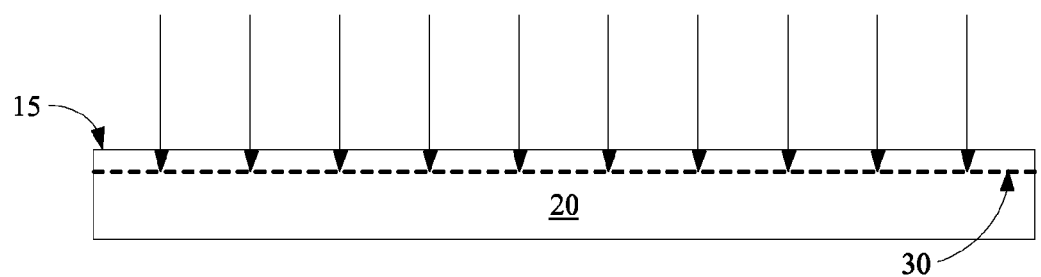
FIGS. 1a and 1b are cross-sectional views illustrating stages in formation of a photovoltaic assembly formed by the methods of Sivaram et al., U.S. patent application Ser. No. 12/026,530, and Kell et al., U.S. patent application Ser. No. 13/331,909.
Figure 1B:
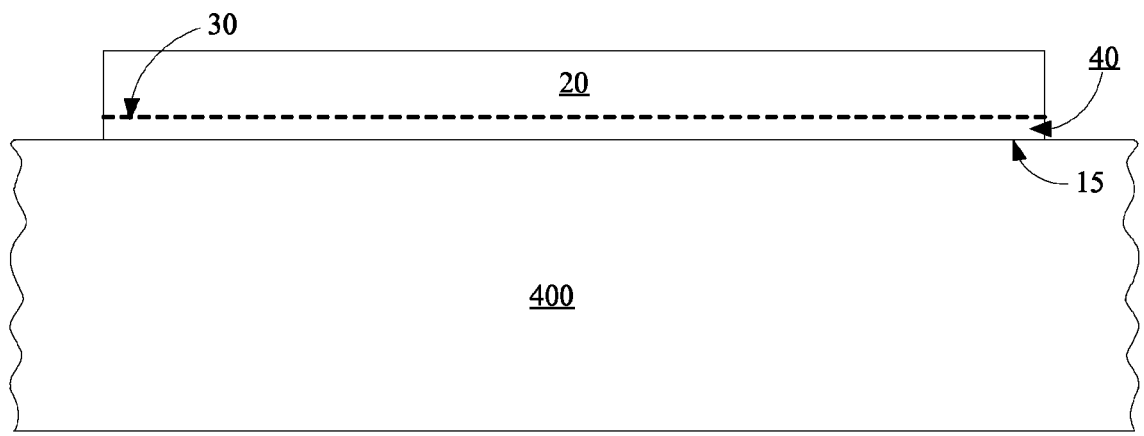

Sivaram et al., U.S. patent application Ser. No. 12/026,530, "Method to Form a Photovoltaic Cell Comprising a Thin Lamina," filed Feb. 5, 2008, and Kell et al., U.S. patent application Ser. No. 13/331,909, "Method and Apparatus for Forming a Thin Lamina," filed Dec. 20, 2011, owned by the assignee of the present invention and hereby incorporated by reference, describe the fabrication of a photovoltaic cell comprising a thin semiconductor lamina formed of non-deposited semiconductor material. Referring to FIG. 1a, a semiconductor donor wafer 20 is implanted through a first surface 15 with one or more species of gas ions, for example hydrogen and/or helium ions. The implanted ions define a cleave plane 30 within the semiconductor donor wafer 20. As shown in FIG. 1b, donor wafer 20 is contacted at first surface 15 to a support element 400. An anneal step causes a lamina 40 to cleave from donor wafer 20 at cleave plane 30, creating a second surface. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick or between about 4 and about 20 or between about 5 and about 15 microns thick, though any thickness within the named range is possible. Alternatively, a plurality of donor wafers may be affixed to a single, larger receiver, and a lamina cleaved from each donor wafer. In embodiments of Kell, et al., lamina 40 may be free standing after exfoliation and not bound to any support element such as support element 400.

Using the methods of Sivaram et al., and others, photovoltaic cells and other electronic devices, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use. Thin lamina obtained by methods of Sivaram et al., as well as other methods may be used for in a variety of devices in addition to photovoltaic devices, such as CMOS devices, LED devices and the like.

The present method provides for a permanently supported thin lamina. In some embodiments the method comprises the steps of providing a donor body comprising a first surface, and implanting ions into the first surface of the donor body to define a cleave plane. A fragile lamina having a first and second surface may be exfoliated from the donor body at the cleave plane, where the first surface of the donor body is a first surface of the lamina and the second surface is opposite the first surface. The lamina may have a thickness between the first surface and the second surface of, for example, less than 25 microns. The lamina may be bound to a temporary support element on either the first surface or the second surface of the lamina, and the bonding may comprise the application of a decomposable adhesive between the lamina and the temporary support element. Low temperature processing steps may be performed to the opposite surface on which the temporary support element is bonded. A permanent support element may be applied to the lamina on the opposite surface on which the temporary support element is bonded. The temporary support element may then be debonded from the lamina, where the debonding comprises decomposing the adhesive.

In some embodiments of the present disclosure, a thin, free standing lamina may be formed and separated from a donor body without adhesive or permanent bonding to a support element, thus beneficially providing for any number of processing steps to the front or back surface of the lamina. Handling a thin lamina formed by these methods may present difficulties not addressed by prior methods due to the fragile nature of the lamina. In the present invention, a permanently supported thin lamina may be formed by first bonding a lamina to a temporary support element via a decomposable adhesive. The lamina may be fixed onto a temporary support element with a decomposable adhesive to provide a bond that is releasable at a defined temperature. The fragile lamina may be beneficially bound, processed and released from the support element with a minimum of shear force such as less than 0.5 psi or about 0 psi.

Devices formed by this method may provide for a reduction in manufacturing steps because costly and abrasive adhesive removal steps are not needed. Additionally, a semiconductor material may be provided on a temporary support for processing that does not require grinding, cutting or any other thinning step. An aspect of this invention is that the use of a temporary support element bound with a decomposable adhesive provides for the transfer of a fragile lamina from a non-bonded support element, such as susceptor or other specialized chuck, to downstream manufacturing stations without damage to the lamina.

Another optional aspect of this invention is that the temporary support element may be applied to either the first, second or both sides of the lamina sequentially or simultaneously, advantageously providing for a wide variety of processing steps on either side of the lamina. In addition, the appropriate choice for decomposable adhesive provides for a tunable manufacturing process. For example, low temperature electrical contacts may be bonded to a thin, fragile lamina while it is fixed to a temporary support as in U.S. patent application Ser. No. 13/425,877 by Murali et al, entitled "Method for Fabricating Backside-Illuminated Sensors" filed Mar. 21, 2012, owned by the assignee of the present invention and hereby incorporated by reference for all purposes.

Bonding to the temporary support with an adhesive that may be decomposed at certain conditions (e.g., where the low temperature electrical contacts such as amorphous silicon, aluminum, zinc, titanium, tungsten, molybdenum, silver, chromium, cobalt, indium, tin or any combination thereof are stable) beneficially simplifies the manufacturing process.

Conventionally, thick laminas are bonded to a substrate and ground or etched to a desired thinness. Decomposable adhesives in the art are typically used for high temperature applications (above 280° C.) such as for affixing thick wafers to a support in order to grind thick wafers into thinner wafers. Once wafers are thinned, the high decomposition temperature adhesive must be removed before the application of low temperature electrical elements.

In contrast, handling a lamina which is already thin (such as those disclosed in this application, less than 25 microns) presents new issues for this fragile, free-standing lamina. The use of a low decomposition temperature adhesive to bond a temporary support to such a thin, fragile lamina provides a method for stabilizing the thin lamina and simultaneously allowing for the application of low temperature processes (e.g., applying low temperature electrical contacts).

Figure 2:
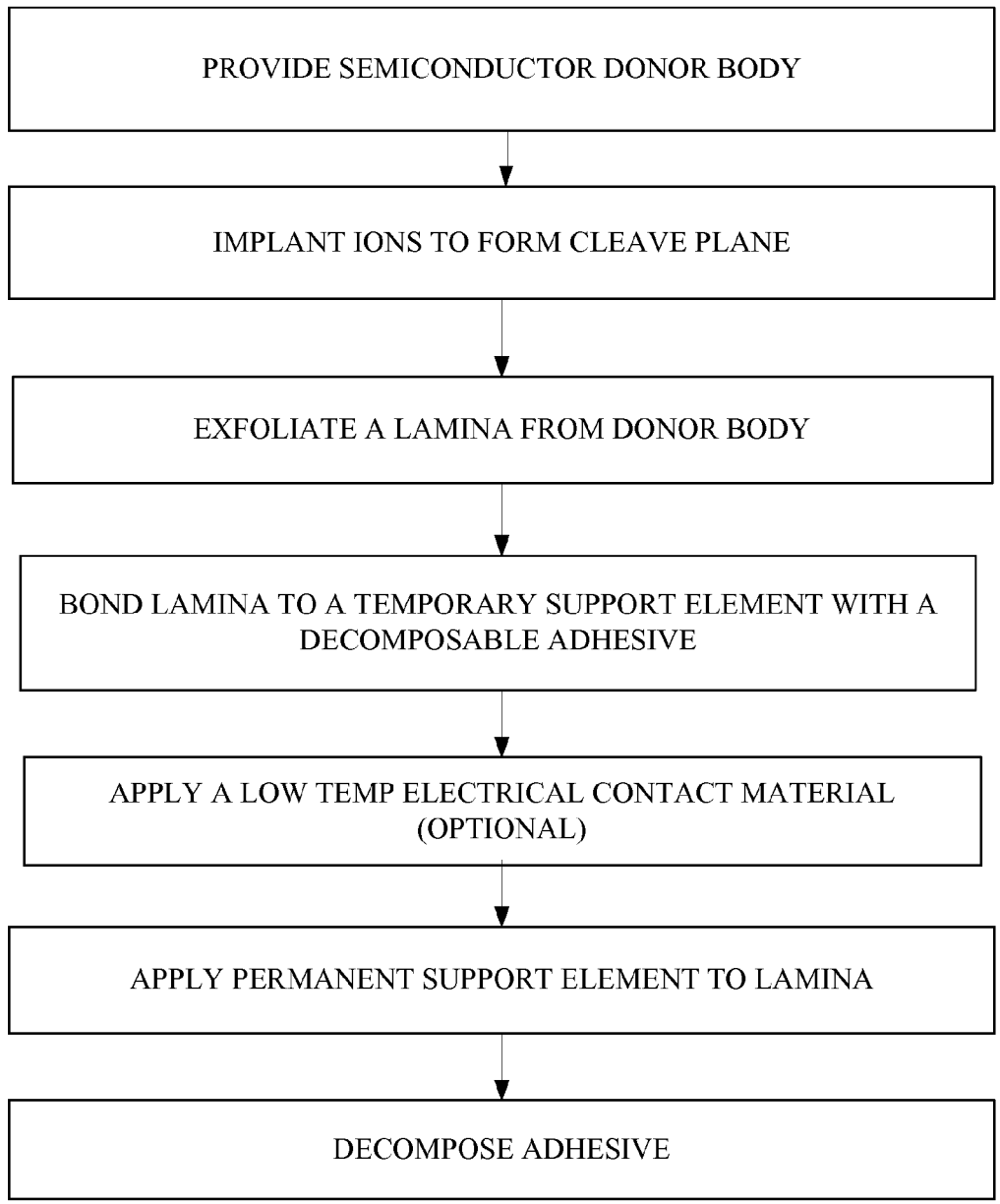
FIG. 2 is a flow diagram illustrating steps in some embodiments of the invention.

In some embodiments, a lamina may be formed by exfoliation from a donor body as outlined in FIG. 2. The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively, wafers or ingots of other semiconductors materials, including germanium, silicon germanium, or III-V or II-VI semiconductor compounds such as GaAs, InP, etc may be used. An ion implantation step occurs in which a cleave plane is formed at a depth defined by the ion implantation parameters. Next, an exfoliation step causes a lamina to form such that the thickness of the lamina is determined by the depth of the cleave plane. The semiconductor lamina has a first surface and a second surface opposite the first, and a thickness between the first surface and second surface. The thickness may be, for example, about 50 microns or less, or 25 microns or less. The lamina may be very fragile and unable to withstand shear forces of greater than 0.5 psi without the fixed support of a temporary or permanent element. After exfoliation, the lamina may be bonded on either its first or second surface to a temporary support element using a decomposable adhesive, after which any additional processing step or steps may occur. The decomposable adhesive may be applied by, for example, dispensing it as drops onto the surface, brushing it on, spin coating etc. In some embodiments, the decomposable adhesive may be applied as a layer over substantially the entire surface of the temporary support element. In other embodiments, the decomposable adhesive may be applied in discontinuous locations. The temporary support element may be, for example, a flat plate fabricated from aluminum, stainless steel, graphite glass, silicon etc. The lamina may be free from any bound support prior to bonding it to the temporary support element. In some embodiments, processing steps may include applying one or more additional materials to the lamina, such as low temperature electrical contacts (e.g., amorphous silicon, aluminum, zinc, titanium, tungsten, molybdenum, silver, chromium, cobalt, indium, tin or any combination thereof), the formation of transparent layers, or any other processes needed in order to make an electrical device. A permanent support may be applied to the lamina and the temporary support element may then be debonded from the lamina by the decomposition of the adhesive. The adhesive may be decomposed by any method, such as the application of heat, light or any combination thereof. The decomposition of the adhesive may provide for the separation of the temporary support element from the lamina with little or no force applied to the lamina. The adhesive may be broken down into component parts that are benign and do not affect the processing or performance of the completed device. In some embodiments the decomposition products of the adhesive may be primarily hydrogen, carbon and oxygen. One aspect of this invention is that the decomposition conditions may be adjusted by the choice of adhesive material in such a way that additional material contacted to the lamina during subsequent processing steps are not affected by the decomposition of the adhesive.

Figure 3:
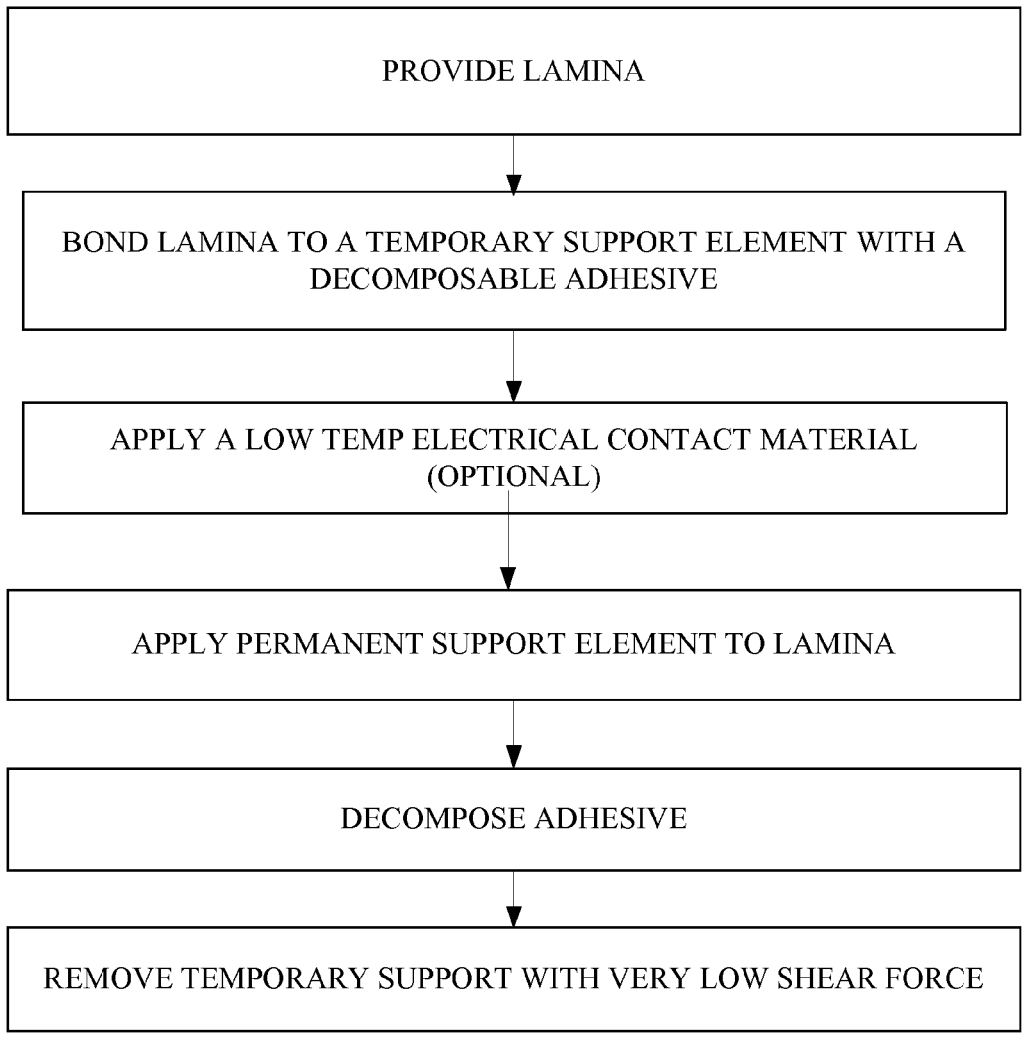
FIG. 3 is a flow diagram illustrating steps in some embodiments of the invention.

In some embodiments as shown in FIG. 3, the lamina may be provided from a thick semiconductor wafer by methods such as grinding, sawing or any means that require the wafer to be fixed to a temporary support element with a high temperature (such as greater than 250° C.) resistant bond. After the formation of a lamina by any means, the lamina may be removed from the temporary support element. The lamina may be free standing and have a thickness less than 50 microns thick, such as less than 25 or 15 or 5 microns thick. The lamina may be fragile; that is, not able to support a load of greater than about or 0.0006 PSI, when supported at a single point or an edge during processing or transport, without fracturing. Thus, a temporary support bound to the fragile lamina provides for the support of the lamina at many points, or, ideally, across its entirety, as the lamina is processed. A temporary support may be bonded to either side of the thin lamina to provide for structural support and improved physical integrity during subsequent processing steps. The lamina may be bonded to the temporary support using a decomposable adhesive that is releasable at low temperatures, such as below 250° C. The device may be subsequently processed in any way, such as the application of a low temperature electrical contact material. The low temperature electrical contact material may be a continuous layer, or may be discontinuous, such as in the form of solder bumps or strips. A permanent support may be constructed or applied to the lamina, and the temporary support may be debonded by the decomposition of the decomposable adhesive. The decomposition conditions may be mild enough to prevent the degradation or melting of the low temperature electrical contact materials as well as provide for the removal of the temporary support with the application of minimal or no shear force on the lamina. In some embodiments the decomposition temperature may be less than 285° C. or less than 250, 235, 200, 150, or 125° C. Decomposition may be facilitated by the presence of a catalyst in the adhesive. The catalyst may be photo-reactive. In some embodiments the temporary support element may comprise a transparent material such as glass, and decomposition of the adhesive may be initiated by the irradiation of the adhesive with light such as ultraviolet light. The temporary support may be removed from the lamina and optionally reused. The temporary support element may be removed in such a way that the shear force on the lamina is very low, such as less than 0.5 psi. In some embodiments the shear force applied to the lamina to remove the temporary support is about 0 psi.

Figure 4A:
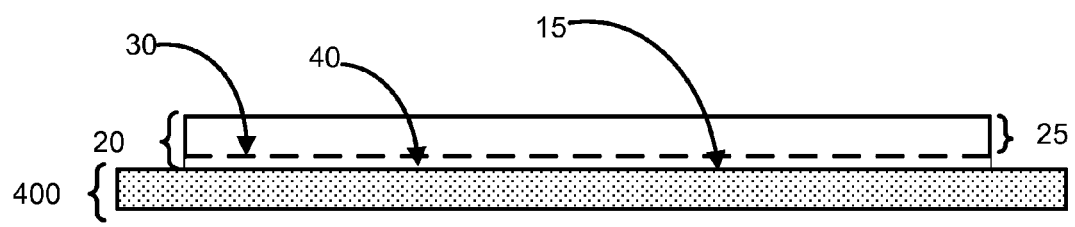
FIGS. 4a and 4b are cross-sectional views illustrating stages of an embodiment of the present invention.
Figure 4B:
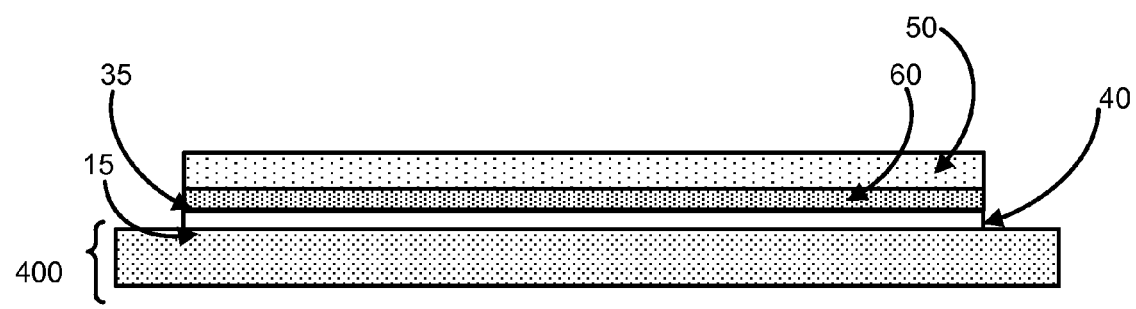

An embodiment of a method of this invention is shown in FIGS. 4a and 4b in which a free standing lamina is exfoliated from a semiconductor donor body. Prior to exfoliation of a lamina from a semiconductor donor body, a first surface 15 of donor body 20 of the present invention may be separably contacted to a temporary support element, such as a susceptor assembly 400. The contact between the donor body 20 and the susceptor assembly 400 may comprise any type of separable force or adherence such as a vacuum, electrostatic or adhesive force. In some embodiments, the interacting force between donor body 20 and susceptor 400 during exfoliation of a lamina is solely the weight of the donor body 20 on the susceptor 400 as shown in FIG. 4a. In other embodiments where the exfoliation equipment has a configuration which is inverted vertically from that shown in FIG. 4a, the interacting force is solely the weight of the susceptor assembly 400 on the donor body 20. Following the contacting of the donor body 20 to the susceptor assembly 400, heat or other force may be applied to the donor body 20 to cleave a lamina from the donor body 20 at the cleave plane 30, forming a lamina 40 with a first surface 15 and second 35 surface (FIG. 4b). Exfoliation conditions may be optimized to cleave the lamina from the donor body in order to minimize physical defects in a lamina exfoliated in the absence of an adhered support element. Exfoliation may be performed at temperatures between, for example, about 350 and about 650 degrees C. In general, exfoliation proceeds more rapidly at higher temperature.

Following exfoliation, the donor body 25 (sans exfoliated lamina) may be removed and optionally reused. The contact between the susceptor assembly 400 and the lamina 40 may be direct, or there may be any number of intervening layers or materials between lamina 40 and susceptor 400, such as layers of amorphous silicon or metal, electrical contacts, regions of doped material or any other material or layers of material. After exfoliation, the lamina 40 may be bonded to a temporary support element 50 via a decomposable adhesive 60 as shown FIG. 4b. The temporary support element 50 and decomposable adhesive 60 may provide structural support to the fragile lamina while being advantageously easy to remove under relatively mild conditions. In some embodiments the bound temporary support element 50 and adhesive 60 may provide the structural stability required for the transfer of the fragile lamina to a downstream processing station. The temporary support element 50 may be any material such as silicon or glass. In some embodiments the temporary support element 50 may be able to withstand a loading force greater than the lamina, such as greater than 0.0006 PSI or greater than 0.002 PSI when supported at one point or edge Thus a fragile lamina bound to a temporary support element may withstand shocks, bumps, shear forces, or impacts from any angle that the lamina unbound would be unable to withstand without fracture or damage.

The adhesive may be a tunable polymer composition that has been designed to decompose at particular range of temperatures such as between 50° C. and 285° C. In some embodiments the adhesive may comprise a polymer or combination of polymers such as poly(propylene carbonate) (PPC), poly(ethylene carbonate) (PEC), poly(butylene carbonate) (PBC), poly(cyclohexene carbonate) (PCHC), poly (limonene carbonate) (PLC), or poly(norbornene carbonate) (PNC) that have a defined decomposition profile. In some embodiments the adhesive may contain a tunable additive such as PPNCL or tetrabutylammonium acetate or any other additive that may affect the decomposition temperature of an adhesive decomposition. The decomposition range of the adhesive may be above 90° C., such as between 90° C. and 285° C., or between 100° C. and 250° C., or between 100° C. and 235° C. or between 100° C. and 150° C. The temperature for the onset of decomposition for the adhesive may be less than 285° C., such as less than 250, 235, 200, 150, or 100° C. The decomposition of the lamina may be substantially free of metal off-gassing. In some embodiments the decomposition products of the adhesive may be primarily volatile hydrocarbons and carbon dioxide.

Figure 5A:
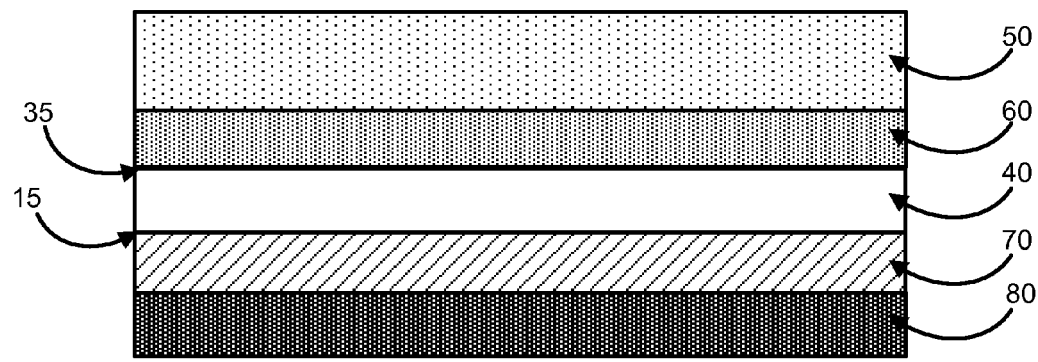
FIGS. 5a and 5b are cross-sectional views illustrating further stages in an embodiment of the present invention.

The adhesive 60 may be applied to the temporary support element 50 by any method, such as spin coating, and affixed to the second surface 35 of lamina 40 as shown in FIG. 5a. The lamina 40 fixed to the temporary support element 50 may now be structurally stable enough to undergo further processing steps such as the fabrication of electronic devices from the lamina. In some embodiments the temperatures of processing steps that occur while the lamina is fixed to the temporary support element do not exceed 285° C., or 250° C., or 160° C., or 150° C. In some embodiments the processing steps may include the application of low temperature electrical contact material 70 to first surface 15 of lamina 40. For example, a layer of amorphous silicon may be applied to first surface 15 of the lamina 40 while the lamina is bound at the first surface 35 to the temporary support element 50 via decomposing adhesive 60. In some embodiments indium-tin solder bumps may be applied to the second surface of the lamina while the lamina is bound to the temporary support element. In some embodiments any material may be applied to the lamina, including materials that may be unstable at temperatures above 100, 150, 200 or 250° C. One aspect of the present invention is that the lamina may be processed with temperature sensitive materials while supported with a temporary support element that provides for improved tensile strength. A permanent support element 80, such as but not limited to, silicon, glass, or metal, may be fixed to the first side 15 of lamina 40. Any number of intervening layers may be disposed between the lamina 40 and the permanent support element 80. In an alternative embodiment (not shown), the lamina may be transferred from one temporary support on a first side of the lamina to another temporary support on the opposite side of the lamina, providing for the bonding of a permanent support to the first side of the lamina.

Figure 5B:
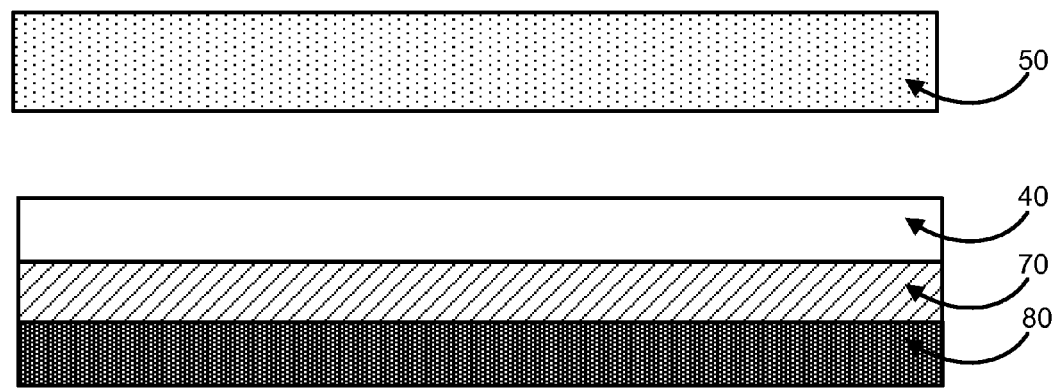

Once the permanent support 80 is fixed to the lamina 40, the temporary support 50 may be separated from the lamina as shown in FIG. 5b. The lamina 40 may be fixed onto permanent support 80 with one or more intervening layers such as low temperature electrical contact elements 70 disposed between. The adhesive 60 may be decomposed and the temporary support element 50 separated from the lamina 40 with the application of little or no force to the lamina 40. The separation of the lamina 40 from the temporary support may occur with the application of less than 0.5 psi of force such as a shear force or a vertical force on the lamina. The decomposition and separation of the lamina may occur over any time period such as less than 20 minutes or less than 10, 5 or 1 minute. In some embodiments the decomposition and separation of the lamina from the temporary support may occur in less than 1 minute, such as less than 30 seconds or less than 15 seconds. The decomposition of the adhesive may result in the formation of volatile hydrocarbons and carbon dioxide. The decomposition products of the adhesive may be benign and have no adverse affects on the texture or physical integrity of the lamina. The support element 50 may be optionally reused. The decomposition of the adhesive may be substantially complete before the separation of the lamina from the temporary support element. This may result in a substantially clean lamina bound to a permanent support and beneficially eliminate additional cleaning steps on the lamina. Another aspect of this invention is that the decomposition of the adhesive provides for the easy removal of the temporary support element under conditions where a contaminant or other particulate matter is present between the temporary support and the lamina. Such contaminants may prevent the lamina from adhering to the temporary support in localized areas. Applying a force to the fragile lamina in these unsupported areas may result in the tearing or puncturing of the lamina. Thus, it may be advantageous to use an adhesive that does not require substantial force to debond the temporary carrier from the lamina. A decomposable adhesive may therefore result in a smoother removal of a lamina bound from a support element even in the presence of particular matter or other contaminate. The use of a decomposable adhesive beneficially eliminates additional cleaning steps while reducing damage to the lamina during transfer.

Photovoltaic Device Example

Figure 6:
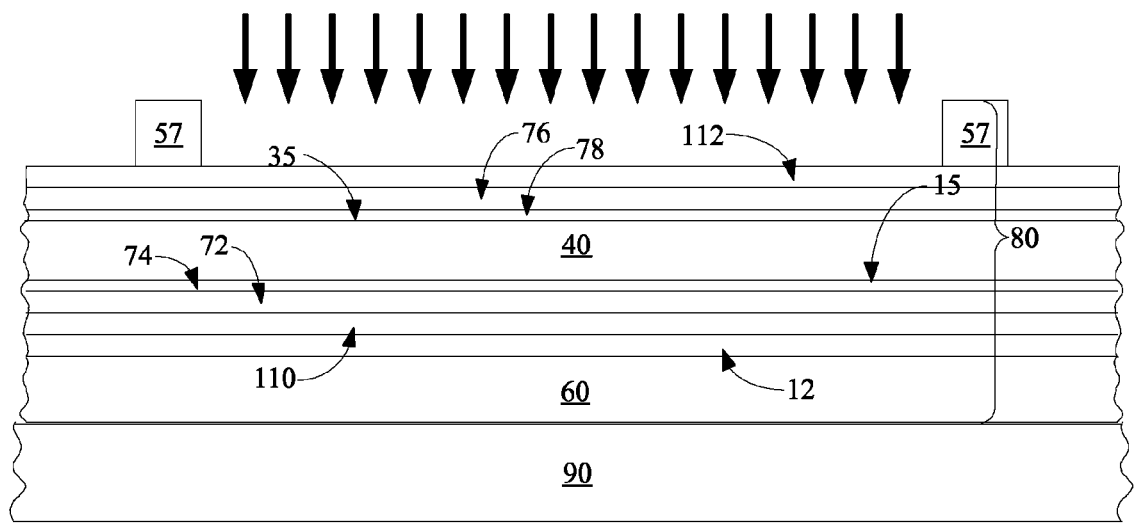
FIG. 6 is a cross-sectional view illustrating stages in the formation of a device from an embodiment of methods of the present invention.

Turning to FIG. 6, the processing of free standing lamina to form a photovoltaic device may occur by using methods of this invention. The lamina 40 may be formed by the exfoliation at a cleave plane from a semiconductor body such as a monocrystalline wafer. After exfoliation, a surface 35 of the lamina may be bound to a temporary support element (not shown) using a decomposable adhesive. Two amorphous silicon layers 72 and 74 and a transparent conducting oxide (TCO) layer 110 may be formed on the opposite surface 15 of the lamina 40, followed by a reflective metal layer 12 while the lamina is bound to the temporary support element with the decomposable adhesive. A permanent support element 60 is then constructed on, or bound to, the surface 15 of lamina 40 after the application of silicon layers 72 and 74. The permanent support 60 may be a metal receiver element, and the lamina may be the base of the photovoltaic device. In some embodiments support element 60 may be metal constructed on the lamina by electroplating or any other method known in the art.

The temporary support element may be removed as described above by the application of heat, light or any combination thereof to the decomposable adhesive, and a photovoltaic assembly 80 may be completed. Amorphous silicon layers 78 and 76 are formed, as is TCO layer 112 and wiring 57 on surface 35. In some embodiments wiring 57 may be formed by screen printing and cured. In the completed device, incident light, indicated by arrows in FIG. 6, enters lamina 40 at surface 35. The structure 80 is shown on a supporting substrate 90. Multiple photovoltaic assemblies 80 may be formed and affixed to supporting substrate 90, which can comprise aluminum or a polymer such as Tedlar™, in order to mount multiple photovoltaic assemblies 80. The thickness of the initially provided thin film semiconductor lamina 40 remains substantially unchanged during fabrication of the photovoltaic device, such as within a 20% deviation of its initially provided thickness, and the depth of the cleave plane from the first surface defines the thickness the monocrystalline base of the photovoltaic cell. Supplying a lamina having a desired thickness that is required in a finished photovoltaic cell advantageously eliminates grinding or thinning of the lamina and provides for processing steps to occur on a first side of a lamina prior to bonding to a temporary support element, thus reducing the number of overall transfer steps during the fabrication process.

Backside-Illuminated Sensor Example

A backside-illuminated (BSI) imaging sensor may also be formed by methods of this invention. The fabrication of such a device may comprise high temperature steps such as the formation of doped regions inside the lamina, as described in U.S. patent application Ser. No. 13/425,877 by Murali et al. These steps may occur prior to bonding the lamina to a temporary support element with a decomposable adhesive. Note that the steps of implanting ions, cleaving the semiconductor donor body, and forming doped regions in the semiconductor material may occur at high temperatures, such as above 450° C. Performing high temperature steps such as the formation of doped regions in the early stages of fabricating a BSI sensor or CMOS device advantageously allows for the more thermally fragile materials to be used in later steps of fabricating a device when the lamina is bound to a temporary support element with a decomposable adhesive.

In some embodiments of the present invention, such as during the manufacture of a completed BSI sensor, the steps of implanting ions, cleaving the semiconductor donor body, and forming the doped region may have processing temperatures above about 450° C. An anneal to form doped regions, for example between about 850 and about 1000° C., is performed in a furnace from between about 30 and about 90 minutes, and diffuses dopants from glass regions into the semiconductor donor body at its front surface. This diffusion forms either doped p-type (from, e.g., borosilicate glass—BSG) or n-type (from, e.g., phosphosilicate PSG) regions. Next a conventional wet etch, for example a hydrofluoric dip, removes the BSG or PSG, leaving doped regions exposed at a front surface of the donor body. Boron and phosphorus are the most commonly used p-type and n-type dopants, respectively, but other dopants may be used. Alternatively, other methods may be used to introduce the dopants, such as diffusion from a gaseous source, or ion implantation. If ion implantation is used, a high temperature anneal step as described above is needed to activate the dopants. After doped regions have been formed in the semiconductor, the lamina may be exfoliated and bonded to a temporary support element with a decomposable adhesive, and low temperature (e.g., less than 250° C.) electrical connections may then be formed.

Figure 7:
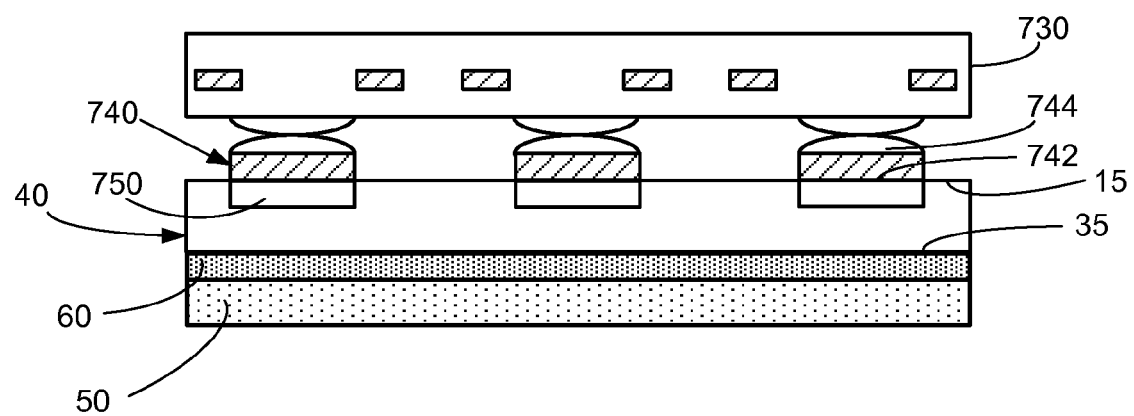
FIG. 7 is a cross-sectional view illustrating stages in the formation of a device from an embodiment of methods of the present invention.

After exfoliation and while bound to the temporary support element 50 with a decomposable adhesive 60, low temperature electrical contact elements may be applied to the lamina 40 as shown in FIG. 7. In some embodiments, the electrical connections may include one or more sub-layers in metallization layer 740 on surface 15 of lamina 40. The metallization layer 740 may be formed by, for example, sputter deposition using physical vapor deposition. The metallization layers 740 may comprise, for example, titanium, titanium-tungsten, or copper. Photolithography methods known in the art may be used to mask and etch the desired wiring patterns in metallization layers 740, to form electrical connections 742 to the doped regions 750 in lamina 40. Subsequent manufacturing steps may then be executed to fabricate a backside-illuminated sensor from the thin film semiconductor lamina 40. For instance, copper-tin, copper-indium or indium-tin bumps 744 may be electroplated onto the metallization layers 740 to facilitate bonding to an integrated circuit 730, which contains the electrical elements needed to read out the signal produced by the doped regions of the lamina. This bonding can be accomplished using any known method that will result in electrical connections between the integrated circuit and the lamina; for example, copper-copper thermo-compression bonding, or solid-liquid inter-diffusion bonding, using copper and tin, or indium and indium, or indium and tin. In some embodiments, integrated circuit 730 may be a complementary metal-oxide semiconductor (CMOS).

After the desired components have been constructed on the front surface 15 of thin lamina 40, temporary support 50 is removed from back surface 35 of the lamina 40 by decomposition of adhesive 60 at temperatures below 285° C., such as below 260, 250, 235, or 100° C. A completed BSI sensor may be fabricated by adding, for example, coatings, color filters, and micro-lenses to the back surface. The thickness of the initially provided thin film semiconductor lamina 40 remains substantially unchanged, such as within a 20% deviation of its initially provided thickness, between the steps of bonding the temporary support element and debonding the temporary support element and during fabrication of the backside-illuminated sensor. Thus, issues created by grinding are reduced, and the ability for processing steps to occur on a first side of a lamina prior to bonding to a temporary support element are provided for. Furthermore, the number of overall transfer steps during the fabrication process is reduced.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a permanently supported thin lamina, the method comprising the steps of:
    a) obtaining a donor body comprising a first surface;
    b) implanting ions into the first surface of the donor body to define a cleave plane;
    c) exfoliating a lamina from the donor body at the cleave plane, wherein the first surface of the donor body is a first surface of the lamina, wherein the step of exfoliating the lamina forms a second surface on the lamina opposite the first surface of the lamina, and wherein the lamina has a thickness between the first surface and the second surface of less than 25 microns;
    d) bonding a temporary support element to either the first surface or the second surface of the lamina, wherein the bonding comprises applying a decomposable adhesive between the lamina and the temporary support element;
    e) applying a permanent support element to the lamina, to the opposite surface on which the temporary support element is bonded; and
    f) debonding the lamina from the temporary support element, wherein the debonding comprises decomposing the adhesive.

2. The method of claim 1 wherein decomposing the adhesive comprises applying a temperature of less than 285° C. to the adhesive.

3. The method of claim 1 wherein the adhesive comprises a catalyst.

4. The method of claim 3 wherein the catalyst is photo-reactive.

5. The method of claim 4 wherein the temporary support element comprises a transparent material, and wherein decomposing the adhesive comprises irradiating the adhesive with ultraviolet light.

6. The method of claim 1 wherein the step of bonding the temporary support element occurs after the step of exfoliating the lamina from the donor body.

7. The method of claim 1 wherein the lamina is free from any bound support element prior to the step of bonding the temporary support element.

8. The method of claim 1 further comprising the step of separating the temporary support element from the lamina using a shear force of less than 0.5 psi.

9. The method of claim 8 wherein the shear force is about 0 psi.

10. The method of claim 1 wherein, after the bonding to the temporary support element, the temperature of the lamina does not exceed 285° C.

11. The method of claim 1 further comprising the step of applying a low temperature electrical contact material to either the first surface or the second surface of the lamina before debonding the lamina from the temporary support element.

12. The method of claim 11 wherein the low temperature electrical contact material is selected from the group consisting of amorphous silicon, aluminum, zinc, titanium, tungsten, molybdenum, silver, chromium, cobalt, indium, tin or any combination thereof.

13. The method of claim 1 wherein the donor body is a monocrystalline semiconductor wafer.

14. The method of claim 13 further comprising the step of fabricating a photovoltaic cell, wherein the lamina comprises a substantially monocrystalline base of the photovoltaic cell.

15. The method of claim 14 wherein the depth of the cleave plane from the first surface defines the thickness of the monocrystalline base of the photovoltaic cell.

16. The method of claim 1 wherein the step of applying a permanent support element comprises constructing a permanent support element on either the first surface or the second surface of the lamina, and wherein the permanent support element comprises metal.

17. The method of claim 1 wherein the thickness of the lamina remains within a 20% deviation of its initially provided thickness between the steps of bonding the temporary support element and debonding the temporary support element.

18. The method of claim 1 wherein the lamina cannot withstand a load of greater than 0.0006 PSI when supported at one point, without fracturing.

19. A method for forming a permanently supported thin lamina, the method comprising the steps of:

a) obtaining a monocrystalline lamina having a first surface, a second surface, and a thickness between the first surface and the second surface, wherein the thickness is less than 25 microns, and wherein the lamina is free from any bound support;
b) bonding a temporary support element to the first surface of the lamina, wherein the bonding comprises applying a decomposable adhesive between the lamina and the temporary support element;
c) applying a permanent support element to the second surface of the lamina; and
d) debonding the lamina from the temporary support element, wherein the debonding comprises decomposing the adhesive.

20. The method of claim 19 wherein the step of applying a permanent support element comprises constructing a permanent support element on the lamina, and wherein the support element comprises metal.

21. The method of claim 19 wherein the thickness of the lamina remains within a 20% deviation of its initially provided thickness between the steps of bonding the temporary support element and debonding the lamina from the temporary support element.

22. The method of claim 19 wherein decomposing the adhesive comprises applying a temperature of less than 285° C. to the adhesive.

23. The method of claim 19 further comprising the step of separating the temporary support element from the lamina using a shear force of less than 0.5 psi.

24. The method of claim 19 further comprising the step of applying a layer of amorphous silicon to either the first surface or the second surface of the lamina before debonding the lamina from the temporary support element.

* * * * *